United States Patent [19]

Jones et al.

[11] Patent Number: 5,346,856
[45] Date of Patent: Sep. 13, 1994

[54] METHOD OF MAKING A SELECTIVE COMPOSITIONAL DISORDERING OF A GAAS BASED HETEROSTRUCTURE BY THE IN-DIFFUSION OF AU THROUGH A SINGLE CRYSTAL, EPITAXIALLY GROWN GE FILM

[75] Inventors: Kenneth A. Jones, Brick, N.J.; Howard S. Lee, Vulaines sur Seine, France

[73] Assignee: The United States of America as represented by the Secretary of the Army, Washington, D.C.

[21] Appl. No.: 60,073

[22] Filed: May 10, 1993

[51] Int. Cl.$^5$ ............................................. H01L 21/20
[52] U.S. Cl. .................................. 437/132; 437/129; 437/132; 437/133; 437/126
[58] Field of Search ................. 437/126, 129, 132, 133

[56] References Cited

U.S. PATENT DOCUMENTS

| | | | |
|---|---|---|---|
| 4,824,798 | 4/1989 | Burnham et al. | 437/132 |
| 5,013,684 | 5/1991 | Epler et al. | 437/129 |
| 5,121,067 | 6/1992 | Marsland | 324/637 |

OTHER PUBLICATIONS

Deppe et al, "Atom Diffusion and Impurity-Induced Layer Disordering in Quantum Well III-V Semiconductor Heterostructures", J. Appl. Phys. 64(12), Dec. 1988.

W. D. Laidig, et al, Appl. Phys. Lett. 38, 776 (1981) in disorder of an AlAs-GaAs SL by impurity diffusion.

*Primary Examiner*—R. Bruce Breneman
*Assistant Examiner*—Ramamohan Rao Paladugu
*Attorney, Agent, or Firm*—Michael Zelenka; William H. Anderson

[57] ABSTRACT

A method for producing a buried heterostructure active devices and a passive waveguide by providing a heterostructure substrate such as a superlattice having at least one planar GaAs layer and at least one AlGaAs layer adjacent to it. A single crystal germanium layer is epitaxially deposited on the superlattice substrate. A layer of gold is deposited on the germanium layer. The gold and germanium layers are imagewise patterned and selected portions etched away. The patterned substrate is encapsulated in a compatible, heat resistant encapsulating material. The encapsulated substrate is then annealed at a temperature of up to about 350° C.

14 Claims, 1 Drawing Sheet

METHOD OF MAKING A SELECTIVE COMPOSITIONAL DISORDERING OF A GAAS BASED HETEROSTRUCTURE BY THE IN-DIFFUSION OF AU THROUGH A SINGLE CRYSTAL, EPITAXIALLY GROWN GE FILM

GOVERNMENT INTEREST

The invention described herein may be manufactured, used and licensed by or for the Government for governmental purposes without the payment to us of any royalty thereon.

FIELD OF THE INVENTION

The invention pertains to the field of semiconductor device fabrication and in particular to a method for producing waveguides and buried heterostructure devices such as double heterostructure lasers, quantum wire structures and quantum dot structures.

BACKGROUND OF THE INVENTION

Light emitting, transmitting and detecting semiconductor devices are well known in the art. In the field of optoelectronics, it is known that doped gallium arsenide and other semiconductor materials can emit light upon the application of a current, and are therefore useful in the manufacture of double heterostructure quantum well, and quantum wire lasers, and light emitting diodes. With a properly chosen semiconductor sandwich structure, light can also be guided within the semiconductor, and it can also be detected by optical detectors. One of the more widely used light emitting devices is a heterojunction light emitter which is fabricated, for example, using a gallium arsenide/aluminum gallium arsenide material system. In such devices, a pair of layers such as aluminum gallium arsenide of opposite conductivity type are sandwiched around an active region of a smaller band gap material such as gallium arsenide. The interfaces between the active region and the wide band gap layers form a pair of heterojunctions. These heterojunctions effectively provide both carrier and optical confinement. Double heterojunctions are also used to confine light in waveguides. The light emitters are generally energized by using an electrical current but they can also be optically pumped. Light emitting devices such as those described are generally grown by metal organic vapor phase epitaxy (MOVPE), molecular beam epitaxy (MBE), liquid phase epitaxy, or other suitable thin film deposition techniques. The most preferred means to control vertical dimensions in semiconductor devices is to grow thin films by MBE or MOVPE. These are used to form multilayers of semiconductors having various band gaps. The control of lateral dimensions by forming layers of different band gaps laterally allows the manufacture of such advanced devices as high performance heterostructure lasers, passive optical waveguides, quantum well boxes and quantum well wires. Such has been achieved in the art by impurity induced lattice disordering which causes the discrete layers to interdiffuse thereby forming a more homogeneous mixture. The properties of the homogenized layer are approximately the average of the two originally separate layers. An important point is that the homogenized layer has a larger energy gap and a smaller index of refraction than the GaAs layer, thus enabling the homogenized region to confine and guide the light generated in the GaAs layer.

DESCRIPTION OF THE PRIOR ART

Impurity-induced layer disordering or layer intermixing in AlGaAs heterostructures and superlattices is well known. Deppe, et al, Atom Diffusion and Impurity-Induced Layer Disordering in Quantum Well III-V Semiconductor Heterostructures, J. Appl. Phys. 64(12), December 1988, shows that impurity-induced layer disordering has developed into an important method for laterally confined quantum well heterostructure device fabrication as well as laser diode structures and passive waveguides. W. D. Laidig, et al, Appl. Phys. Lett. 38, 776 (1981) showed that AlAs-GaAs superlattices exhibit intermixing when zinc is introduced into the superlattice followed by annealing to produce a homogeneous material with an averaged aluminum concentration. The introduction of zinc reduced the annealing temperature at which superlattice intermixing occurs. Others have introduced such p-type or n-type dopants as silicon, germanium, sulfur, tin, selenium, beryllium and magnesium to produce lattice disordering of superlattices by in-diffusion or ion implantation. Mechanisms for impurity-induced layer disordering in AlGaAs-GaAs quantum well heterostructures are also known in the art. Impurity-induced layer disordering in these structures have produced large increases in aluminum and gallium self-diffusion rates due to the presence of large concentrations of impurities. It has been theorized that the increase in aluminum and gallium self-diffusion is due to charged Column III and Column V vacancies. Another theory based on annealing experiments on doped and undoped AlGaAs/GaAs superlattices under ambient conditions with varying gallium and arsenic partial pressures is that Column III vacancies and Column III interstitials are responsible for increased aluminum and gallium diffusion when large concentrations of impurities are present. A principal disadvantage of impurity-induced layer disordering is the temperature required to induce intermixing. For AlGaAs/GaAs superlattices diffused with the most common n-type dopant, namely silicon, temperatures on the order of 800° C. are required to induce complete intermixing. While much interdiffusion occurs where the silicon diffusion is confined to certain regions by lithography, some intermixing will also occur between the AlGaAs and GaAs layers in the undoped regions at these relatively high temperatures. This intermixing in the undoped regions alters the shape of the potential well and results in a shift of the energy levels in the quantum well. An additional difficulty with high temperature impurity-induced layer disordering processes with silicon is that lateral diffusion is significant which makes defining narrow regions very difficult. In addition, the introduction of silicon into the superlattice by ion implantation can result in the creation of large concentrations of defects. Annealing at high temperatures usually does not completely remove these defects. Such defects can behave as deep level traps and have deleterious consequences on the electrical performance of the devices.

SUMMARY OF THE INVENTION

It would therefore be advantageous to be able to use impurity-induced layer disordering for producing optoelectronic circuits at lower processing temperatures and by avoiding ion implantation techniques. The present invention provides a method of achieving impurity-induced layer disordering at lower temperatures than heretofore known. By this invention, enhanced diffusion of germanium in GaAs ohmic contacts for superlattice structures is attained. It has been found that the use of gold enhances the diffusion of germanium into GaAs ohmic contacts for superlattice structures at temperatures of approximately 300° C. to 350° C. The Ge and Au also enhance the intermixing of the Ga and Al in much the same way. Ge/GaAs contacts annealed at such low temperatures have been shown to exhibit little germanium in-diffusion whereas Ge/Au/GaAs contacts exhibit significant germanium diffusion into the GaAs. When gold and germanium are deposited at localized regions in a Au/Ge/AlGaAs/GaAs superlattice structure, a low temperature annealing enhances the diffusion of germanium into the superlattice resulting in a homogeneous lattice disordering of the superlattice. Nonalloyed Au-Ge ohmic contacts have been made using a single crystal Ge film grown on oxide free GaAs surfaces under ultrahigh vacuum conditions. The use of an epitaxial single crystal film on an oxide free surface provides for excellent control of the diffusion process thereby providing for more accurate control of the interface between the mixed and unmixed regions because it eliminates grain boundary diffusion and diffusion through an oxide both of which introduce anisotropy into the process. This is particularly important in fabricating quantum wires and/or boxes. This invention solves problems commonly associated with compositional disordering by reducing processing temperatures and reducing lattice damage utilizing the low temperature in-diffusion of Ge and Au and the subsequent intermixing of Ga and Al. Further, the use of single crystal epitaxially grown Ge defines clearer boundaries between mixed and unmixed regions. As a result, higher efficiency wave guides, heterostructure lasers, and quantum well devices can be produced since boundaries are more clearly delineated. Quantum well laser devices thusly produced are more efficient, more monochromatic and less stressed.

Accordingly, the invention provides a method for producing a buried heterostructure device which comprises first providing a substrate which has GaAs/AlGaAs heterostructure films grown on it comprising at least one substantially planar GaAs layer and at least one AlGaAs layer in juxtaposition therewith. A single crystal germanium layer is epitaxially deposited on top of the heterostructure. A layer of gold is deposited on the germanium layer. The gold and germanium layers are imagewise patterned and selected portions etched away. The patterned substrate is encapsulated in a compatible, heat resistant encapsulating material. The encapsulated substrate is then annealed at a temperature of up to about 350° C. for a sufficient time to attain essentially homogeneous disordering in the uppermost region of the AlGaAs/GaAs heterostructure underneath the patterned Au-Ge regions.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION OF THE PREFERRED EMBODIMENT

Figure 1:
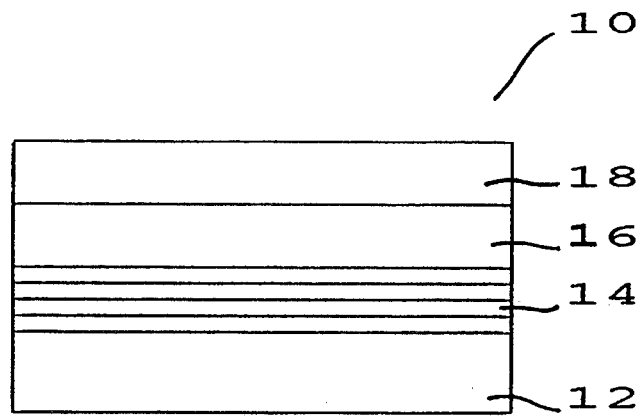
FIG. 1 is a schematic representation of an as grown structure showing gold and single crystal germanium on an AlGaAs/GaAs superlattice on a GaAs substrate.

Referring now to the drawings, FIG. 1 shows a schematic representation of a grown structure 10 having a gallium arsenide semiconductor substrate 12 and a multilayered AlGaAs/GaAs superlattice 14. The superlattice comprises a plurality of interleaved lower gap, active regions sandwiched between higher gap barrier layers. Each active layer is a quantum well having a thickness in the range of about 20 to about 500 Angstroms, with the preferred thickness range being from about 20 to about 200 Angstroms. Each barrier layer should have a thickness of at least about 10 Angstroms and preferably be in the range of from about 10 Angstroms and 200 Angstroms. The number of layers is subject to the choice of the skilled artisan, but generally is in the range of 2 to 100 layers. A single crystal germanium film 16 is grown on top of the GaAs/AlGaAs superlattice, preferably by epitaxial deposition. The epitaxial deposition of the germanium layer on the superlattice substrate is preferably conducted in an ultra-high vacuum system at a temperature of from about 350° C. to about 450° C. The germanium layer has a typical thickness ranging from about 200 Angstroms to about 500 Angstroms. A layer of gold 18 is then deposited on top of the germanium layer, preferably by epitaxial deposition. The epitaxial deposition of the gold layer on the germanium layer is preferably conducted in the same ultrahigh vacuum system without breaking vacuum at a temperature of from about 100° C. to about 150° C. The gold layer typically has a thickness ranging from about 100 Angstroms to about 250 Angstroms. The gold and germanium are deposited under ultrahigh vacuum conditions to attain reduced interfacial contamination and diminished grain boundary diffusion. It is important that the surface of the superlattice be essentially oxide free. The reduction of oxygen is important since oxygen on the GaAs surface can partially block the diffusion of the germanium and gold into the superlattice.

Figure 2:
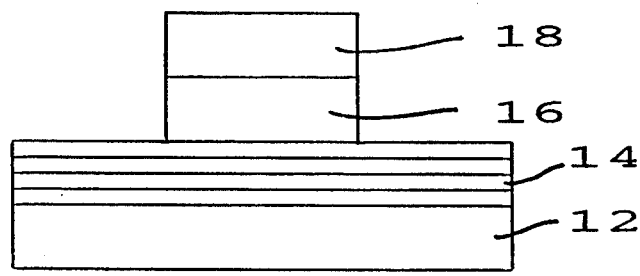
FIG. 2 is a schematic view of a patterned and etched structure showing gold and a single crystal germanium region on an AlGaAs/GaAs superlattice on a GaAs substrate.

In order to allow diffusion only in desired areas, a photoresist mask is laid down on the surface of the gold layer 18 using a well known photolithographic technique. In general, a photoresist composition, such as AZ 1350J, commercially available from Hoechst Celanese Corporation, Somerville, N.J. is applied to the gold surface. The photoresist layer is imagewise exposed to ultraviolet radiation through a mask and developed. The exposed areas are then removed leaving a positive image on the surface of the gold. The uncovered gold areas are then etched away followed by a similar etching away of the uncovered germanium layer. By removing portions of layers 16 and 18 underlying exposed portions of the photoresist composition, corresponding portions of the upper surface of the superlattice are uncovered. Then the balance of the photoresist is removed. FIG. 2 is a schematic view of a final patterned and etched structure showing gold and a single crystal germanium region on an AlGaAs/GaAs superlattice on a GaAs substrate.

Figure 3:
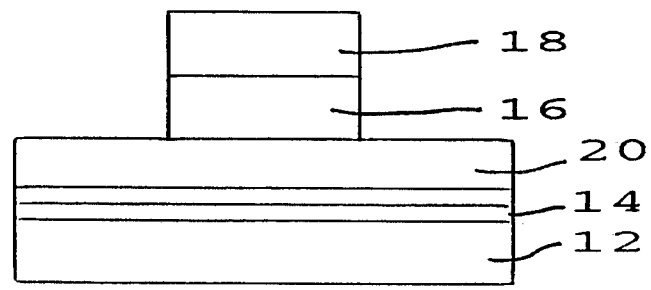
FIG. 3 is a schematic view of the structure after annealing showing gold and single crystal germanium diffusion into the AlGaAs/GaAs superlattice on the GaAs substrate.

The structure of FIG. 2 is then encapsulated in a compatible, heat resistant encapsulating material that can be deposited at relatively low temperatures, and annealed. Suitable encapsulating materials non-exclusively include silicon nitride ($Si_3N_4$) and silicon dioxide, with silicon nitride being most preferred. The encapsulated substrate is then annealed at a temperature of up to about 350° C., preferably from about 300° C. to about 350° C. for a sufficient time to attain essentially homogeneous disordering in the uppermost region of the AlGaAs/GaAs superlattice that is beneath the patterned gold-germanium layers. This is usually for from about 2 to about 30 hours. Lower temperatures can be used, however, diffusion takes a correspondingly longer time and hence it would not be as economical. As a result, the GaAs/AlGaAs superlattice below the germanium and gold homogenizes due to the in-diffusion of gold and germanium. This greatly enhances the out-diffusion of gallium. There is little interdiffusion below the region where there is no germanium and gold layers. FIG. 3 is a schematic view of the structure after annealing showing gold and single crystal germanium diffusion into the AlGaAs/GaAs superlattice on the GaAs substrate. Essentially homogeneous compositional disordering is produced in the uppermost region 20 of the AlGaAs/GaAs superlattice.

A plurality of light emitting devices can be grown on a single substrate and then subsequently isolated by selective introduction disordering, as described, to create individual devices in a monolithic environment. Devices such as double heterostructure lasers can be improved by the further confinement provided by the intermixed layers on either side of the active GaAs region. When the confining regions are in close proximity to each other, a quantum well wire laser can be fabricated which is a potentially more efficient laser. The intermixed layers on either side of the active GaAs layer can also be used to form waveguides which can direct the light around the chip.

The following non-limiting example serves to illustrate the invention.

EXAMPLE 1

An AlGaAs/GaAs superlattice is grown on a GaAs substrate comprising several alternating AlGaAs and GaAs layers each about 100 Angstroms thick. The growth direction, defined to be the z direction, has quantum confinement because the feature size, i.e. the layer thickness, is very small. However, there is no confinement in the plane of growth which is the x-y plane. A single crystal germanium crystal is grown on top of the AlGaAs/GaAs superlattice by epitaxial deposition at 400° C. This can be done because the lattice constant of the germanium is almost the same as that of the AlGaAs and GaAs. A thin film of gold is epitaxially deposited on top of the germanium at 100° C. A layer of a photoresist composition is formed on top of the gold surface. Using a mask, an image is transferred to the photoresist to provide a pattern which is a very narrow slit parallel to the x-direction. The gold and germanium layers that are exposed after the photoresist has been developed are etched away. Encapsulate the thusly formed wafer in silicon nitride and anneal at 340° C. to attain essentially homogeneous solid phase compositional disordering in the uppermost region of the AlGaAs/GaAs superlattice beneath the regions covered by the patterned gold-germanium layers. The AlGaAs/GaAs superlattice below the germanium and gold homogenizes because the in-diffusion of gold and germanium enhances the out-diffusion of the gallium. There is little interdiffusion below the region where there is no germanium and gold layers. Thus the patterned slit is reproduced as a superlattice that is a line parallel to the x-direction. There is now confinement in the y-direction by the homogenized material that was a superlattice prior to the homogenizing anneal. This structure is said to be a quantum wire because there is quantum confinement in two directions, namely the y-direction and the z-direction, when the homogenized regions are less than 1000 angstroms apart.

What is claimed is:

1. A method for producing a buried heterostructure device comprising the steps of:
   a.) providing a superlattice substrate comprising at least one planar GaAs layer and at least two AlGaAs layers each in juxtaposition with the GaAs layer;
   b.) epitaxially depositing a single crystal germanium layer on the superlattice substrate;
   c.) depositing a gold layer on the germanium layer;
   d.) imagewise patterning and etching away selected portions of the gold and germanium layers;
   e.) encapsulating the superlattice substrate in a compatible, heat resistant encapsulating material; and
   f.) annealing the encapsulated superlattice substrate to attain homogeneous disordering in an uppermost region of the superlattice substrate.

2. The method of claim 1 wherein the superlattice substrate comprises a plurality of alternating GaAs and AlGaAs layers in a sandwiched configuration.

3. The method of claim 1 wherein the superlattice substrate comprises 2 to 100 alternating GaAs and AlGaAs layers in a sandwiched configuration.

4. The method of claim 1 wherein each GaAs layer has a thickness in the range of about 20 to about 500 Angstroms.

5. The method of claim 1 wherein each GaAs layer has a thickness in the range of about 20 to about 200 Angstroms.

6. The method of claim 1 wherein each AlGaAs layer has a thickness in the range of about 10 to about 200 Angstroms.

7. The method of claim 1 wherein the epitaxial deposition of the germanium layer on the superlattice substrate is conducted at a temperature of from about 350° C. to about 450° C.

8. The method of claim 1 wherein the depositing the gold layer on the germanium layer is conducted at a temperature of from about 100° C. to about 150° C.

9. The method of claim 1 wherein the germanium layer has a thickness ranging from about 200 Angstroms to about 500 Angstroms.

10. The method of claim 1 wherein the gold layer has a thickness ranging from about 100 Angstroms to about 250 Angstroms.

11. The method of claim 1 wherein the annealing of the encapsulated substrate is conducted at a temperature of from about 300° C. to about 350° C.

12. The method of claim 1 wherein the annealing of the encapsulated substrate is conducted for from about 2 to about 30 hours.

13. The method of claim 1 wherein the encapsulating material is silicon nitride.

14. The method of claim 1 wherein the encapsulating material is silicon dioxide.

* * * * *